United States Patent
Zhang et al.

(10) Patent No.: US 9,123,886 B2
(45) Date of Patent: Sep. 1, 2015

(54) HIGH MOMENT WRAP-AROUND SHIELDS FOR MAGNETIC READ HEAD IMPROVEMENTS

(71) Applicant: Headway Technologies, Inc., Milpitas, CA (US)

(72) Inventors: Kunliang Zhang, Fremont, CA (US); Min Li, Fremont, CA (US); Junjie Quan, Milpitas, CA (US); Yewhee Chye, Hayward, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/785,255

(22) Filed: Mar. 5, 2013

(65) Prior Publication Data

US 2014/0252518 A1    Sep. 11, 2014

(51) Int. Cl.
*H01L 29/82* (2006.01)
*H01L 43/12* (2006.01)
*G11B 5/39* (2006.01)
*G01R 33/00* (2006.01)
*G01R 33/025* (2006.01)
*G01R 33/09* (2006.01)

(52) U.S. Cl.
CPC ............ *H01L 43/12* (2013.01); *G01R 33/0076* (2013.01); *G01R 33/025* (2013.01); *G01R 33/093* (2013.01); *G01R 33/098* (2013.01); *G11B 5/3932* (2013.01); *G11B 5/3912* (2013.01)

(58) Field of Classification Search
CPC ...... B82Y 25/00; B82Y 10/00; G11B 5/3932; G11B 2005/3996; G01R 33/093
USPC ............ 260/324.12; 365/158; 257/E29.323, 257/421, 422, 423, 424, 427; 438/3
See application file for complete search history.

(56) References Cited

U.S. PATENT DOCUMENTS

| | | | |
|---|---|---|---|
| 6,266,218 B1 * | 7/2001 | Carey et al. ............ | 360/324.12 |
| 6,704,175 B2 * | 3/2004 | Li et al. .................. | 360/324.11 |
| 8,233,233 B1 | 7/2012 | Shen et al. | |
| 2002/0064002 A1 * | 5/2002 | Gill .......................... | 360/319 |

(Continued)

OTHER PUBLICATIONS

Co-pending U.S. Appl. No. 13/750,401, filed Jan. 25, 2013, "Magnetic Seed for Improving Blocking Temperature and Shield to Shield Spacing in a TMR Sensor," by Junjie Quan et al., 12 pgs.

(Continued)

*Primary Examiner* — David Vu
*Assistant Examiner* — Jonathan Han
(74) *Attorney, Agent, or Firm* — Saile Ackerman LLC; Stephen B. Ackerman

(57) ABSTRACT

A wrap around shield structure is disclosed for biasing a free layer in a sensor and includes a bottom shield, side shields, and top shield in which each shield element comprises a high moment layer with a magnetization saturation greater than that of $Ni_{70}Fe_{30}$. The high moment layers provide a better micro read width performance. Side shield structure includes a stack of antiferromagnetically (AFM) coupled magnetic layers on a second high moment layer. A first (lower) magnetic layer in each side shield is ferromagnetically coupled to the second high moment layer, and to a first high moment layer in the bottom shield. A third (upper) magnetic layer in each side shield is ferromagnetically coupled to a third high moment layer in the top shield for improved stabilization. Sensor sidewalls may terminate at a top surface of a reference layer to decrease reader shield spacing.

18 Claims, 5 Drawing Sheets

(56) References Cited

U.S. PATENT DOCUMENTS

| | | | |
|---|---|---|---|
| 2006/0114622 A1* | 6/2006 | Gill | 360/324.12 |
| 2006/0198059 A1* | 9/2006 | Sakai et al. | 360/324.12 |
| 2010/0330395 A1* | 12/2010 | Zhang et al. | 428/813 |
| 2011/0032645 A1 | 2/2011 | Noel et al. | |
| 2012/0161263 A1* | 6/2012 | Maat et al. | 257/422 |
| 2012/0164486 A1 | 6/2012 | Bonhote et al. | |

OTHER PUBLICATIONS

Co-pending U.S. Appl. No. 13/785,227, filed Mar. 5, 2013, "Thin Seeded Antiferromagnetic Coupled Side Shield for Sensor Biasing Applications," by Kunliang Zhang et al., 31 pgs.

Co-pending U.S. Appl. No. 13/803,362, filed Mar. 14, 2013, "A Reader Sensor Structure and Its Method of Construction," by Min Li et al., 39 pgs.

* cited by examiner

HIGH MOMENT WRAP-AROUND SHIELDS FOR MAGNETIC READ HEAD IMPROVEMENTS

RELATED PATENT APPLICATIONS

This application is related to the following: Ser. No. 13/750,401, filing date Jan. 25, 2013; Ser. No. 13/785,227, filing date Mar. 5, 2013; and Ser. No. 13/803,362, filing date Mar. 14, 2013; assigned to a common assignee and herein incorporated by reference in their entirety.

TECHNICAL FIELD

The present disclosure relates to a wrap around shield design for a sensor element in a read head, and in particular to a stabilized shield structure for thin film magnetoresistive (MR) sensors that enables improved resolution through better micro magnetic read width (uMRW) in high areal density hard disk drives.

BACKGROUND

In a magnetic recording device in which a read head sensor is based on a spin valve magnetoresistance (SVMR) or a giant magnetoresistance (GMR) effect, there is a constant drive to increase recording density. One method of accomplishing this objective is to decrease the size of the sensor element in the read head. The sensor is a critical component in which different magnetic states are detected by passing a sense current through the sensor and monitoring a resistance change. A GMR configuration includes two ferromagnetic layers which are separated by a non-magnetic conductive layer in the sensor stack. One of the ferromagnetic layers is a pinned layer wherein the magnetization direction is fixed by exchange coupling with an adjacent antiferromagnetic (AFM) pinning layer, for example. The second ferromagnetic layer is a free layer wherein the magnetization vector can rotate in response to external magnetic fields, and is aligned either parallel or anti-parallel to the magnetic moment in the pinned layer to establish a "0" or "1" memory state. When an external magnetic field is applied by passing the sensor over a recording medium at an air bearing surface (ABS), the free layer magnetic moment may rotate to an opposite direction. Alternatively, in a tunneling magnetoresistive (TMR) sensor, the two ferromagnetic layers are separated by a thin non-magnetic dielectric layer. A sense current is used to detect a resistance value which is lower in a "0" memory state than in a "1" memory state. In a CPP configuration, a sense current is passed through the sensor in a direction perpendicular to planes of the layers in the sensor stack.

Ultra-high density (over 100 Gb/in$^2$) recording requires a highly sensitive read head in which the cross-sectional area of the sensor is typically smaller than 0.1×0.1 microns at the ABS. Current recording head applications are typically based on an abutting junction configuration in which a hard bias layer is formed adjacent to each side of a free layer in a spin valve structure. As the recording density further increases and track width decreases, the junction edge stability becomes more important so that edge demagnification in the free layer needs to be reduced. In other words, horizontal (longitudinal) biasing is necessary so that a single domain magnetization state in the free layer will be stable against all reasonable perturbations while the sensor maintains relatively high signal sensitivity.

Referring to FIG. 1, a schematic drawing of a read-back cross track profile is illustrated which is obtained by scanning the read head across a given data track and plotting the read-back amplitude vs. the off-track distance (distance from track center). The 100% amplitude is the read-back signal when the head is positioned perfectly at track center while uMRW-10% and uMRW-50% are the 10% and 50% micro magnetic read widths that are defined by the width of the cross track profile in FIG. 1 at amplitudes corresponding to 10% and 50% of the track center amplitude. A higher cross track resolution read head requires better uMRW sharpness which means reducing the x-axis distance between −x2 and x2 for uMRW-50% and minimizing the x-axis distance between −x1 and x1 for uMRW-10%. In other words, the slope of line 60 should be more vertical to enable higher resolution. As the device size becomes smaller, it is desirable to achieve higher read-back resolution in the cross track direction. As a result, the read head will have less side reading of data tracks on the sides of the current track to reduce interference at high track densities.

In conventional longitudinal biasing read head designs, hard bias films of high coercivity are abutted against the edges of the sensor and particularly against the sides of the free layer. There may be a thin seed layer between the hard bias layer and free layer. By arranging for the flux flow in the free layer to be equal to the flux flow in the adjacent hard bias layer, the demagnetizing field at the junction edges of the aforementioned layers vanishes because of the absence of magnetic poles at the junction. As the critical dimensions for sensor elements become smaller with higher recording density requirements, the free layer becomes more volatile and more difficult to bias. Traditional biasing schemes using a hard magnet bias have become problematic due to randomly distributed hard magnetic grains within the hard bias layer. Since current technology is unable to provide an improved biasing structure that is capable of stabilizing a sensor in an ultra-high density recording device with high reliability while simultaneously achieving high resolution (uMRW sharpness), a new design for effective longitudinal biasing is needed.

SUMMARY

One objective of the present disclosure is to provide a biasing scheme for a free layer in a sensor structure that has magnetic properties with improved stability compared with stabilization afforded by a single hard bias layer.

A second objective of the present disclosure is to provide a biasing scheme with improved stabilization according to the first objective, and that leads to better micro magnetic read width sharpness than in conventional biasing structures.

According to one embodiment of the present disclosure, these objectives are achieved with a wrap around shield structure for a magnetic read head wherein side shields comprised of a high moment layer are formed along opposite sidewalls of the sensor at an ABS, and top and bottom shields have a high moment layer that adjoins top and bottom surfaces, respectively, of the sensor. A high moment material is defined as a metal or alloy having a saturation magnetization (Ms) value greater than that of a NiFe layer wherein the Ni content is about 70 atomic %. Each of the side shields is stabilized with antiferromagnetic (AFM) coupling between a first magnetic layer that is the bottom layer in each side shield stack and a middle magnetic layer in each side shield, and by AFM coupling between the middle magnetic layer and an uppermost third magnetic layer in each side shield.

In a preferred embodiment, the sensor has a bottom spin valve configuration with an AFM layer, synthetic antiferromagnetic (SAF) reference layer, non-magnetic spacer, free layer, and capping layer sequentially formed on a bottom shield such that a bottom surface of the AFM layer contacts the bottom shield and a top surface of the capping layer interfaces with the top shield. The bottom shield has an uppermost layer that is a first high moment layer, and the top shield has a lower layer contacting the sensor that is a third high moment layer where both of the high moment layers have a Ms greater than that of $Ni_{70}Fe_{30}$. In one aspect, a continuous sidewall is formed on both sides of the sensor at the ABS and on a sensor back side, and along all sensor layers such that the sidewall connects to the top shield and the bottom shield. Alternatively, the sidewall may terminate at a bottom surface of the non-magnetic spacer so that the AFM layer and SAF reference layer form a continuous film on the bottom shield and effectively become part of the bottom shield thereby reducing the shield to shield distance or reader shield spacing (RSS). The free layer is formed in a plane that is orthogonal to the ABS and with a magnetic moment in a direction parallel to the ABS.

There is a first section of a non-magnetic insulation layer adjoining the sensor sidewall, and a second section thereof that extends outward from the sensor and along a top surface of the bottom shield. The second section of insulation layer is formed in a plane that is parallel to the planes of the sensor layers and serves as a substrate for the side shields comprised of antiferromagnetically coupled layers. A key feature of the side shields is a composite structure that includes a lower seed layer which contacts a top surface of the insulation layer. Above the seed layer is sequentially formed a second high moment layer, a first magnetic layer, a first antiferromagnetic (AFM) coupling layer, a second magnetic layer, a second AFM coupling layer, and a third magnetic layer as the uppermost layer in the side shield stack. Each of first, second, and third magnetic layers is comprised of one or both of CoFe and NiFe such as a NiFe/CoFe configuration for the first magnetic layer, CoFe for the second magnetic layer, and CoFe/NiFe for the third magnetic layer. Preferably, the second high moment layer is formed on the first section of insulation layer along the sensor sidewall, and on the second section above the bottom shield. The high moment layer in each side shield and in the top and bottom shields has a thickness from 5 to 50 Angstroms and is comprised of CoFe, FeNi, Fe, or an alloy thereof with one or more of Ni, Mo, Hf, Zr, Nb, and the like wherein the Fe content in the FeNi or FeNi alloy is at least 30 atomic %. Each of the AFM coupling layers may be made of Ru, for example.

The magnetization in both of the bottom and top shields is aligned in a first cross-track direction that is parallel or antiparallel to the magnetic moment in the free layer. Furthermore, the first and third magnetic layers in the side shields are ferromagnetically coupled to the high moment layer in the bottom shield and top shield, respectively, and thus have a magnetization aligned in the same direction as that in the bottom and top shields. As a result of the AFM coupling configuration, the second magnetic layer in the side shield has a magnetization opposite to the magnetization in the first and third magnetic layers. In effect, the first high moment layer and first magnetic layer in each side shield are ferromagnetically coupled and provide the majority of the longitudinal biasing to the free layer. Through ferromagnetic coupling with the bottom shield and AFM coupling within the side shield stack, the first magnetic layer and each side shield are stabilized to a greater extent than realized with prior art stabilization schemes. The high moment layers are advantageously used to improve the micro magnetic read width performance thereby enhancing cross-track resolution in the read head.

The present disclosure also includes a method of forming a sensor that is stabilized with side shields having an AFM coupling configuration, and forming the wrap around shield structure comprised of high moment layers. Once a sensor stack of layers is formed on a bottom shield having an uppermost high moment layer, a photoresist patterning and ion milling sequence is employed to define the sensor shape including the continuous sidewall. Then an insulation layer and side shield layers are sequentially formed such that the uppermost layer in the side shields is essentially coplanar with a top surface of the sensor. After the photoresist layer is removed, the third high moment layer is deposited followed by the remainder of the top shield. The third high moment layer contacts a top surface of the sensor and the side shields.

DETAILED DESCRIPTION

The present disclosure is a wrap around shield design, and a method for making the same, for biasing a sensor element in a read head wherein AFM coupling is employed to stabilize the magnetic layers in the side shield that provides the bulk of longitudinal biasing to the free layer, and all shields include a high moment layer to improve uMRW in the read head. The wrap around shield structure is useful with GMR or TMR sensors that have a top spin valve, bottom spin valve, or dual spin valve configuration. A high moment layer is a magnetic material with a Ms value greater than that of a $Ni_{70}Fe_{30}$ layer. Note that magnetization is a term which is used interchangeably with "magnetic moment".

Figure 1:
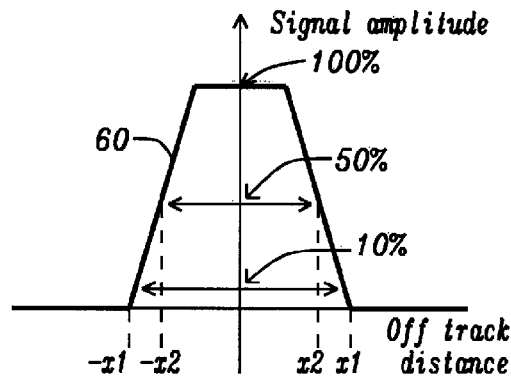
FIG. 1 is a plot of a read-back cross track profile where signal amplitude is plotted against off-track distance to determine a measure of sharpness in signal amplitude.
Figure 2:
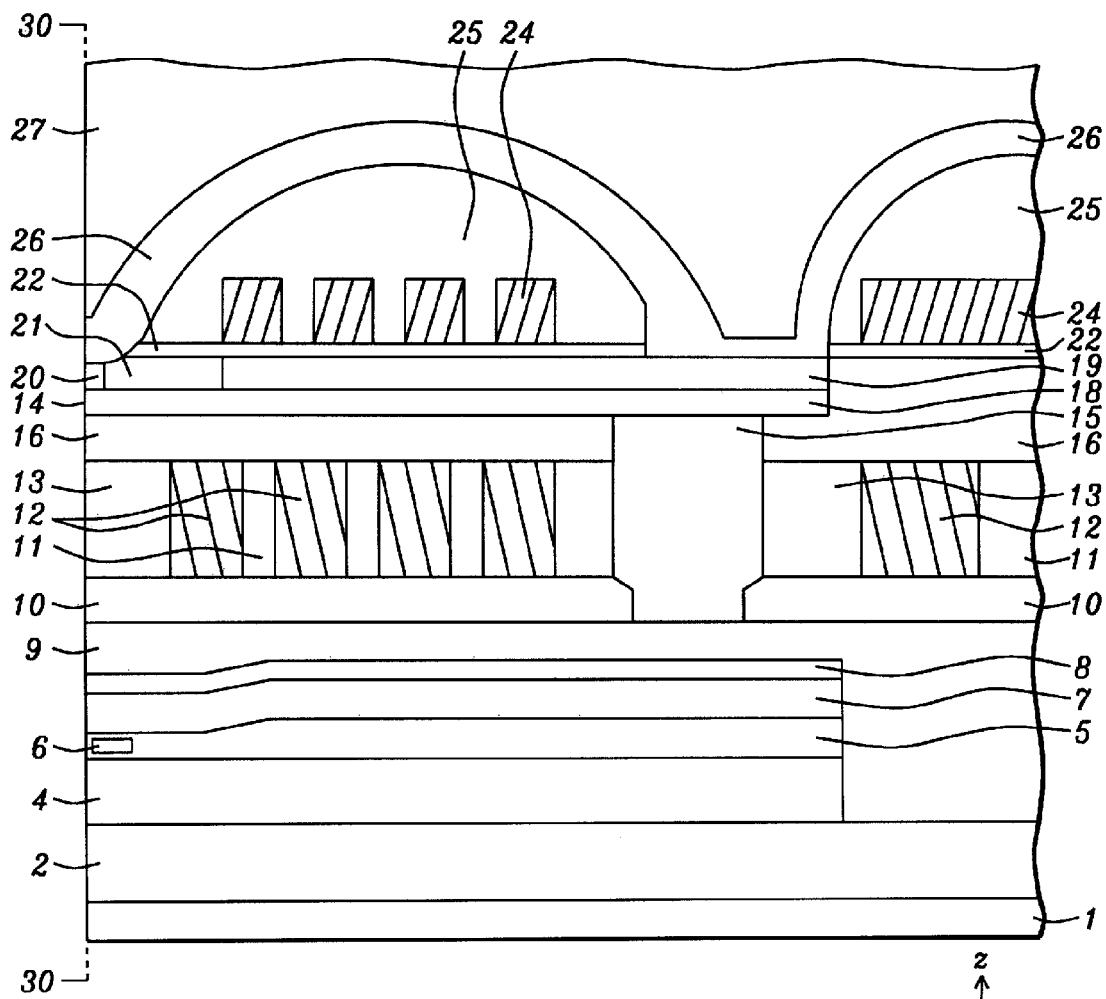
FIG. 2 is a cross-sectional view showing a merged read/write head with a sensor element formed along an ABS and between top and bottom shields in the read head portion.

Referring to FIG. 2, one embodiment of a recording head of the present disclosure is depicted in a cross-sectional view from a plane orthogonal to an air bearing surface (ABS) 30-30. The z-axis indicates a down-track direction, the y-axis is perpendicular to the ABS and extends towards a back end of the device, and the x-axis is the cross-track direction. The read/write head is formed on a substrate 1 that may be comprised of AlTiC (alumina+TiC). The substrate 1 is typically part of a slider (not shown) formed in an array of sliders on a wafer. After the read/write head is fabricated, the wafer is sliced to form rows of sliders. Each row is typically lapped to afford an ABS before dicing to fabricate individual sliders that are used in a magnetic recording device. An insulation layer 2 is disposed on the AlTiC substrate 1 and may be made of a dielectric material such as alumina.

A bottom shield 4 also referred to as the S1 shield is formed on insulation layer 2 and may be comprised of NiFe, for example. There is a read gap 5 that is an insulation layer between the S1 shield and a top (S2A) shield 7. A magnetoresistive element or sensor 6 is formed in the read gap 5 along the ABS 30-30 and typically includes a plurality of layers (not shown) in which two ferromagnetic layers are separated by a non-magnetic layer. The magnetic moment direction in one of the ferromagnetic layers is fixed and provides a reference direction, and the moment direction in the other ferromagnetic layer may be rotated by the magnetic field from a magnetic medium proximate to the ABS. Resistance across the read gap changes as the moment in the second ferromagnetic layer rotates. A "0" or "1" magnetic state can be defined depending on whether the two ferromagnetic layers are magnetically aligned in the same direction or in an anti-parallel fashion. The non-magnetic layer in the sensor 6 may be Cu in a giant magnetoresistive (GMR) sensor or may be comprised of an insulator such as alumina or MgO in a tunneling magnetoresistive (TMR) sensor.

Above the top shield 7, an insulation layer 8 and a top shield (S2B) layer 9 are sequentially formed. Top shield layers 7, 9 may be made of the same magnetic material as in the S1 shield 4 and insulation layer 8 may be the same dielectric material as in insulation layer 2. Those skilled in the art will recognize that layers 2-9 represent the read head portion of the read/write head and layers 9-27 represent the write head portion. Note that the S2B layer 9 may serve as a flux return pole in the write head portion of the read/write head.

The present disclosure anticipates that various configurations of a write head may be employed with the read head portion. In the exemplary embodiment, there is a first section of an insulation layer 10 formed on the S2B shield layer 9 and between the ABS 30-30 and a back gap connection 15. Note that the insulation layer 10 has a second section that adjoins the back gap connection along a side opposite the first section. A heater (not shown) may be included in one of the aforementioned insulation layers to induce thermal expansion of the sensor and write head toward a magnetic medium along the ABS during a recording process. A bucking coil layer 12 is disposed on insulation layer 10 and is shown with four turns between the back gap connection 15 and ABS 30-30 that are separated from each other by an insulation layer 11 comprised of a photoresist material. The portion of bucking coil layer 12 closest to the ABS 30-30 is coplanar with an insulation layer 13 that is formed along the ABS. Insulation layers 10, 11, 13 are comprised of a dielectric layer and bucking coil layer is typically a conductive material such as Cu. The back gap connection 15 may be made of CoFeNi or the like and magnetically couples main pole layer 18 to S2B shield layer 9 that serves as a flux return pole.

An insulation layer 16 is formed on insulation layers 11, 13 and on bucking coil layer 12 and a first section extends from the ABS 30-30 to the back gap connection 15. Both of the insulation layers 11, 16 have a second section on the opposite side of the back gap connection 15 with respect to the ABS. Above the insulation layer 16 is a main pole layer 18 that may be comprised of CoFeNi or another magnetic material. Main pole layer 18 has a pole tip 14 at the ABS 30-30 and extends toward the back end of the device with a sufficient length to connect with back gap connection 15. A first write shield layer 20 is disposed on the main pole layer 18 at the ABS and extends a throat height distance (not shown) away from the ABS 30-30 to connect with a non-magnetic layer 21. The first write shield layer 20 may be made of CoFeN, CoFeNi, NiFe, or CoFe, for example, and is coplanar with the non-magnetic layer 21 and a yoke 19 which is formed on the main pole layer 18 and serves to concentrate magnetic flux at the write pole tip 14. There is an insulation layer 22 formed on a portion of the non-magnetic layer 21 and yoke 19. Magnetic flux in the yoke 19 is generated by passing a current through the main coil layer 24 that is disposed on the insulation layer 22.

There is a second shield layer 26 formed on the first shield layer 21 along the ABS and which arches over the main coil layer 24 and connects with the top surface of the yoke 19 in a region overlying the back gap connection 15. An insulation layer 25 is formed on the insulation layer 22 and fills the openings between the turns of the main coil layer 24 and the space between the main coil layer and the arched second shield layer 26. A protection layer 27 covers the second shield layer 26 and is made of an insulating material such as alumina, MgO, or $SiO_2$.

Figure 3:
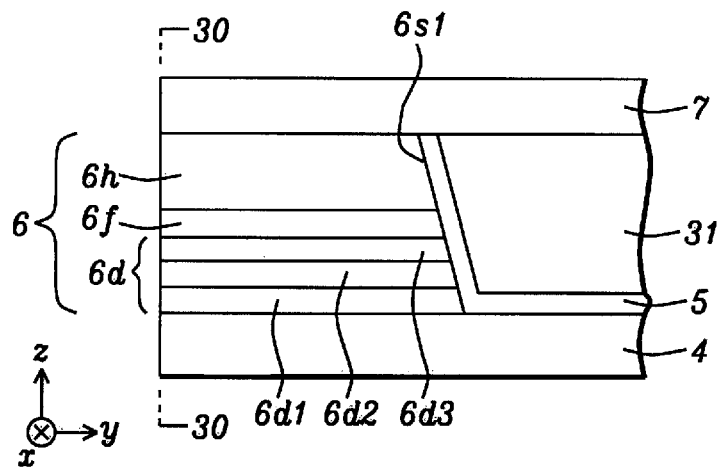
FIG. 3 is an enlarged cross-sectional view of the sensor in FIG. 2 that shows an insulation layer formed along a back side of the sensor and opposite the ABS.

Referring to FIG. 3, an enlarged section of the read head in FIG. 2 is depicted and includes the sensor 6 along the ABS 30-30. Bottom shield 4 and top shield 7 extend in a y-axis direction beyond the sensor back side $6s1$ and towards a back end (not shown) of the read head. According to one embodiment, an insulation layer 31 made of alumina, MgO, or $SiO_2$, for example, is formed on insulation layer 5 along the back side $6s1$ and on a portion of the top surface of bottom shield 4. In other words, no biasing is required along the sensor back side. In an alternative embodiment, layers 5, 31 may be combined into a single insulation layer 5. Note that other layers $6d$, $6h$ within the sensor are formed below and above free layer $6f$, respectively, and may each contain one or more layers.

In a bottom spin valve configuration, layer $6h$ comprises at least a capping layer (not shown), and layer $6d$ typically includes a bottom seed layer $6d1$, a reference layer $6d2$ with a fixed magnetization direction, and a non-magnetic spacer $6d3$ that is between the reference layer and free layer $6f$. In a top spin valve configuration, layer $6d$ typically includes a seed layer while layer $6h$ comprises a reference layer, and a non-magnetic spacer between the reference layer and free layer $6f$. In another aspect, bottom layer $6d1$ may be a composite with a lower seed layer and an upper antiferromagnetic (AFM) layer that contacts the reference layer. The AFM layer may be comprised of IrMn, MnPt, or the like and is used to pin the magnetization direction in the reference layer. We have disclosed in related application HT12-016 that NiFeX where X is W, Rh, Ta, Mo, Hf, Nb, Zr, Ti, or Co may be employed as a seed layer in a sensor rather than a conventional Ta/Ru, Ta/Cr, Ta/Cu, or Ta/NiCr composite seed layer.

Figure 4:
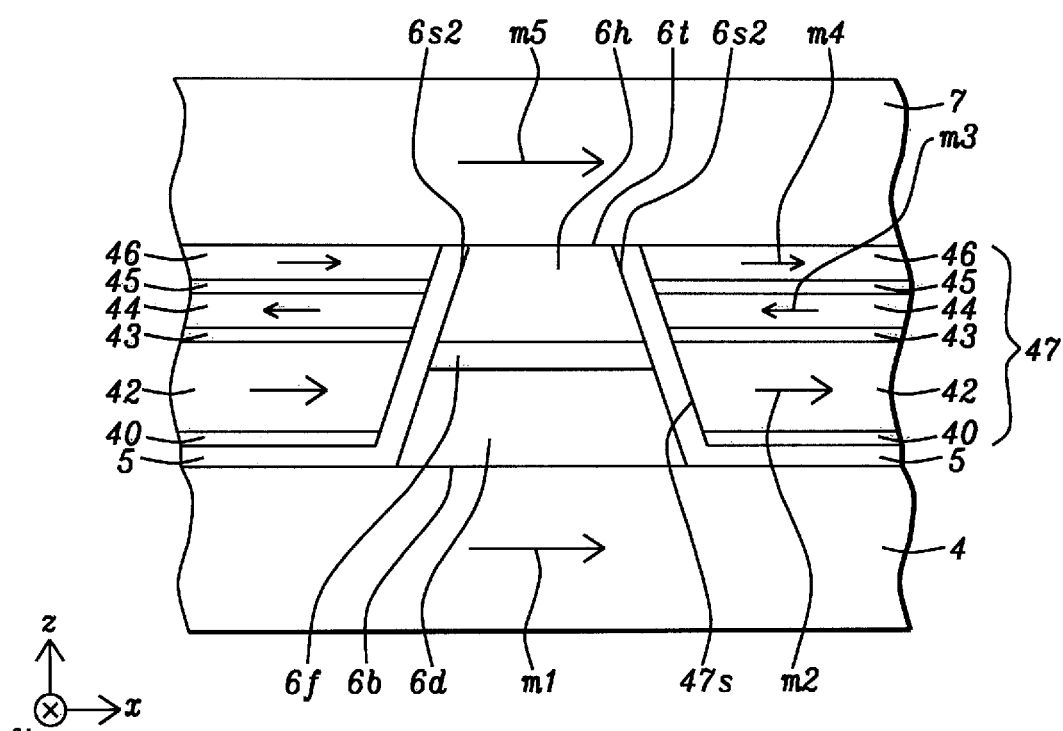
FIG. 4 is a cross-sectional view along the ABS of a sensor that is stabilized by side shields comprised of antiferromagnetic (AFM) coupled layers according to a design previously disclosed by the inventors.

Referring to FIG. 4, the inventors have previously disclosed a stabilized side shield design in related application HT12-020 that is shown in a cross-sectional view from an ABS perspective. The side shield structure is formed between top and bottom shields wherein the side shields 47 provide biasing to the free layer in adjacent sensor 6. The bottom shield 4 has a magnetization m1 aligned in a cross-track (x-axis) direction, and top shield 7 has a magnetization m5 aligned in the same direction as m1. In the exemplary embodiment, free layer $6f$ has a magnetization (not shown) either parallel or anti-parallel to m1 depending on the magnetic state ("0" or "1") of the sensor. The m1 direction is typically set by a first anneal step that is performed before the layers in the sensor are deposited.

A key feature is the side shield structure 47 with sidewalls 47s formed adjacent to sides 6s2 of the sensor and free layer 6f at the ABS and extending a distance of 30 nm to 2 microns from the ABS toward a back end of the read head. Sides 6s2 connect with side 6s1 (FIG. 3) at a certain distance from the ABS and thereby form a continuous sidewall around sensor 6. According to one embodiment, an insulation layer 5 is formed on a top surface of bottom shield 4 except over portions not contacting a sensor bottom surface 6b. The insulation layer also extends along sidewalls 6s2 to separate the sensor from the side shields 47. The lower layer in the side shield structure is a seed layer 40 that contacts the insulation layer 5 in a region above the bottom shield 4. The seed layer may be comprised of one or both of Ru and Ta and has a thickness from 5 to 50 Angstroms, and preferably 5 to 20 Angstroms. Optionally, other face centered cubic (fcc) materials known in the art may be employed as the seed layer to promote a smooth and uniform growth of overlying layers in the side shield structure. Accordingly, the seed layer may be selected from NiCr, NiFeCr, NiFe, Cu, or Ni, or composites such as Ta/NiCr, Ta/NiFeCr, Ta/NiFe, Ta/Cu, Ta/Ni, or composites wherein Ta in the aforementioned compositions is replaced by Hf, Ti, Zr, Nb, Mo, or the like.

Above the seed layer 40 is sequentially formed a first magnetic layer 42, a first antiferromagnetic (AFM) coupling layer 43, a second magnetic layer 44, a second AFM coupling layer 45, and a third magnetic layer 46. As a result, the magnetization m2 of first magnetic layer is aligned anti-parallel to magnetization m3 of the second magnetic layer while magnetization m4 of the third magnetic layer is also aligned anti-parallel to m3. Because of the close proximity of the first magnetic layer 42 to the bottom shield, m2 is aligned parallel to m1 by ferromagnetic coupling. Furthermore, the first magnetic layer preferably has a greater thickness than the second and third magnetic layers and thereby provides a majority of the longitudinal biasing to free layer 6f. Third magnetic layer 46 contacts a bottom surface of top shield 7 which induces m4 to be aligned in the same direction as m5. Consequently, the bottom shield and top shield play a key role in stabilizing the magnetizations m2, and m4, respectively. AFM coupling between first magnetic layer 42 and second magnetic layer 44, and between second magnetic layer 44 and third magnetic layer 46 also contributes to overall stabilization within the side shields 47. Enhanced stabilization of the side shields leads to high output sharpness and improved magnetic read width. Moreover, side shields 47 prevent stray magnetic fields produced by a magnetic medium from inadvertently switching the magnetization direction of the free layer.

Preferably, the first, second, and third magnetic layers are comprised of one or both of CoFe and NiFe wherein the Ni content is between 70 and 90 atomic % to yield a soft magnetic layer. However, other magnetic materials such as CoFeNi may also be suitable for one or more of magnetic layers 42, 44, 46. As an example, first magnetic layer 42 may be a NiFe/CoFe composite wherein the lower NiFe layer has a thickness from 50 to 300 Angstroms, and preferably 50 to 200 Angstroms, while the CoFe layer preferably has a thickness between 5 and 20 Angstroms. Preferably, the second magnetic layer 44 is made of CoFe and has a thickness from 5 to 50 Angstroms. Third magnetic layer 46 may have a CoFe/NiFe configuration wherein the lower CoFe layer contacts the second AFM coupling layer 45 and has a thickness between 5 and 20 Angstroms, and the upper NiFe layer preferably has a thickness from 50 to 200 Angstroms. According to a preferred embodiment, the NiFe layer in first magnetic layer 42 has a greater thickness than the NiFe layer in the third magnetic layer 46 and provides a majority of the biasing to the adjacent free layer 6f.

In one aspect, the AFM coupling layers 43, 45 are made of Ru and have a thickness of 7 to 9 Angstroms to promote maximum AFM coupling between adjacent magnetic layers in the side shields. Alternatively, the AFM coupling layers may have a thickness of about 4 Angstroms or 14 Angstroms and induce AFM coupling between adjacent magnetic layers. In another embodiment, one or both of the AFM coupling layers are made of Rh, RhRu, Re, Ir, Mo, or other metals or alloys that promote antiferromagnetic coupling between first magnetic layer 42 and second magnetic layer 44, and between the second magnetic layer and third magnetic layer 46, respectively.

Figure 5:
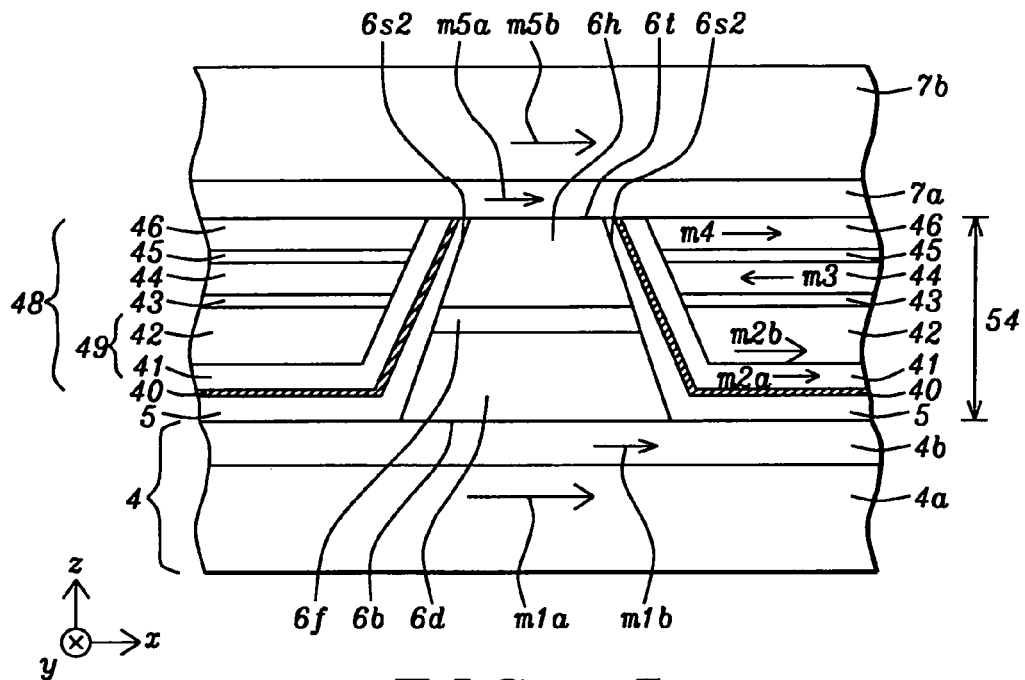
FIG. 5 is a cross-sectional view along the ABS of a sensor that is stabilized by side shields comprised of AFM coupled layers and wherein the top shield, bottom shield, and side shields include a high moment layer to improve micro magnetic read width according to a first embodiment of the present disclosure.

Referring to FIG. 5, a first embodiment of the present disclosure is illustrated and retains all of the elements related to the read head structure in FIG. 4, and further comprises a high moment layer that is included in the side shields 48, top shield 7, and bottom shield 4 of a wrap around shield structure. In particular, a first high moment layer 4b with a thickness from 5 to 50 Angstroms, and preferably between 10 and 30 Angstroms, is employed as an uppermost layer in the bottom shield. A bottom layer 4a of the bottom shield may comprise one or more magnetic layers such as NiFe or an alloy thereof with a Fe content ≤30 atomic % and having a magnetization m1a parallel to the ABS and to the planes of the sensor layers. The first high moment layer 4b is ferromagnetically coupled to bottom layer 4a and has a magnetization m1b that is parallel to m1a. In one aspect, the first high moment layer is CoFe or a CoFeM alloy in which M is one or more of Ni, Mo, Hf, Zr, Nb, and the like wherein the M content comprises less than 10 atomic % of the CoFeM alloy. In an alternative embodiment, the first high moment layer may be Fe or a FeNi alloy in which the Fe content is greater than 30 atomic % and preferably above 40 atomic %.

There is a second high moment layer 41 that is formed on the seed layer 40 above the bottom shield 4 and along sensor sides 6s2. Because of the thin insulation layer, the second high moment layer is coupled to the bottom shield and has a magnetization m2a that is parallel to m1b. Note that the second high moment layer is also coupled to the overlying first magnetic layer 42 which has a magnetization m2b. Layers 41, 42 form a composite magnetic layer 49 that provides a majority of the longitudinal biasing to free layer 6f in the sensor element. The second high moment layer has a thickness between 5 and 50 Angstroms, and preferably from 10 to 30 Angstroms, and is selected from the same materials as described for the first high moment layer.

Magnetic layers 42-46 in each side shield 48 are sequentially formed on second high moment layer 41. Magnetic layers 42, 44, 46 are made of one or both of CoFe and NiFe as described previously and have a thickness range as described for the side shield structure shown in FIG. 4. Therefore, second magnetic layer 44 is AFM coupled to composite magnetic layer 49 through AF coupling layer 43 and has a magnetization m3 in a direction opposite to m1b. In addition, the second magnetic layer is AF coupled through AF coupling layer 45 to third magnetic layer 46 which has a magnetization m4 in same direction as m1b. As a result, the AFM coupling scheme affords improved stabilization of the magnetic layers in side shields 48 similar to the advantage disclosed in related application HT12-020.

The top shield 7 is a composite having a third high moment layer 7a that contacts a top surface 6t of the sensor element and forms an interface with side shields 48 along a top surface of third magnetic layer 46. The top shield also comprises an upper magnetic layer 7b which may have the same composition as bottom layer 4a in the bottom shield. Layer 7b is ferromagnetically coupled to the third high moment layer and has a magnetization m5b aligned in the same direction as the magnetization m5a in third high moment layer 7a. The third high moment layer preferably is selected from the same materials as the first and second high moment layers 4b, 41, and has a thickness between 5 and 50 Angstroms. The reader shield spacing (RSS) 54 in this case is the distance along the z-axis between top surface 6t and bottom surface 6b of the sensor. Top shield 7 influences the direction of m4 in third magnetic layer 46 and further reinforces the magnetization directions within the side shield layers. Moreover, the combined effect of the high moment layers 4b, 41, 7a is to improve the performance of the read head through better uMRW sharpness.

Figure 6:
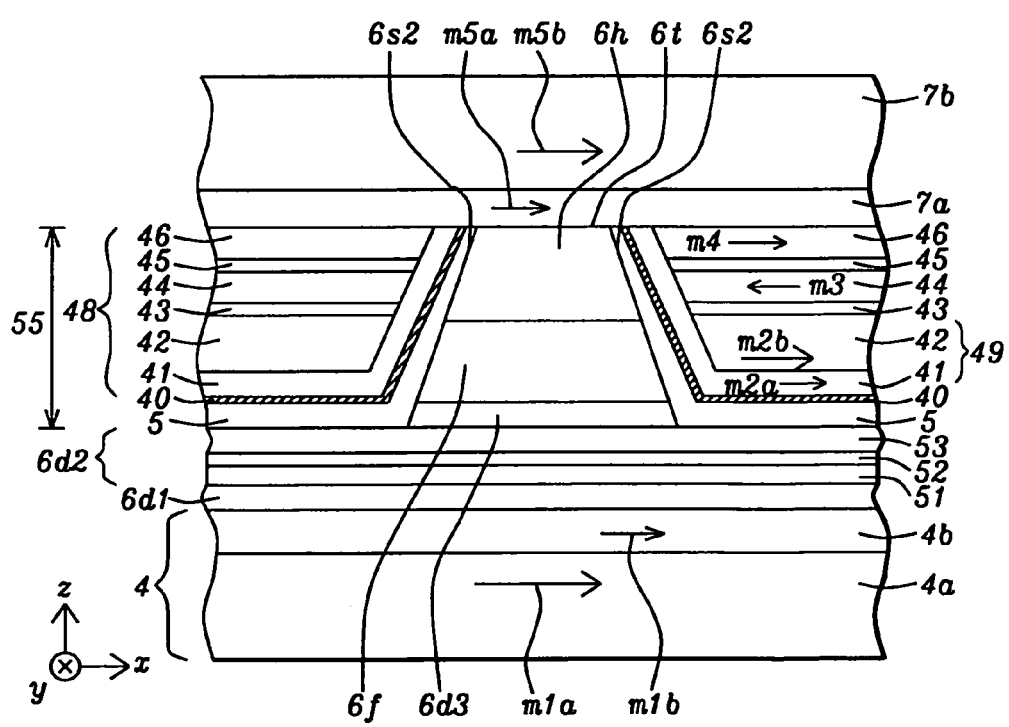
FIG. 6 is a cross-sectional view along the ABS of a sensor that is a modified version of FIG. 5 where the sensor sidewall terminates at a top surface of a reference layer according to a second embodiment of the present disclosure.

Referring to FIG. 6, the present disclosure encompasses a second embodiment that represents a modification of the first embodiment wherein sides 6s2 (and 6s1) of the sensor element terminate at a bottom surface of the non-magnetic spacer 6e. Otherwise, the wrap around shield structure is the same as previously described with regard to FIG. 5 except the insulation layer 5 is formed on a top surface of an unpatterned bottom layer in the MR sensor, and the side shield layers 40-46 are sequentially formed on the insulation layer 5. In the exemplary bottom spin valve configuration, bottom layer 6d1 and reference layer 6d2 are continuous, unpatterned layers and serve as a composite bottom layer in a plurality of sensor elements (not shown) including the sensor comprising upper layer 6h, free layer 6f, non-magnetic spacer 6d3, reference layer 6d2, and bottom layer 6d1 in FIG. 6. Preferably, layer 6d1 is a composite with a lower seed layer and an upper AFM layer (not shown). In one embodiment, reference layer 6d2 has a synthetic antiferromagnetic (SAF) structure made of a lower AP2 layer 51, coupling layer 52, and upper AP1 layer 53. The AFM layer in bottom layer 6d1 serves to pin the magnetic moment in AP2 layer 51 in a direction that is orthogonal to m1b (perpendicular to the ABS). AP1 layer 53 has a magnetic moment aligned in a direction opposite to that of the AP2 layer.

In addition to the benefits of a more stabilized biasing structure and improved uMRW performance provided by the first embodiment, the biasing structure of the second embodiment has a small reader shield spacing 55 compared with RSS 54 in FIG. 5. The effective RSS is the distance along the z-axis between top sensor surface 6t and a top surface of reference layer 6d2. Sides 6s2 connect the sensor top surface with a top surface of reference layer 6d2. Seed layer 40 is formed on portions of the reference layer that extend beyond sides 6s2. In an alternative embodiment, MR sensor sides may extend into a top portion of AP1 layer 53.

Figure 7:
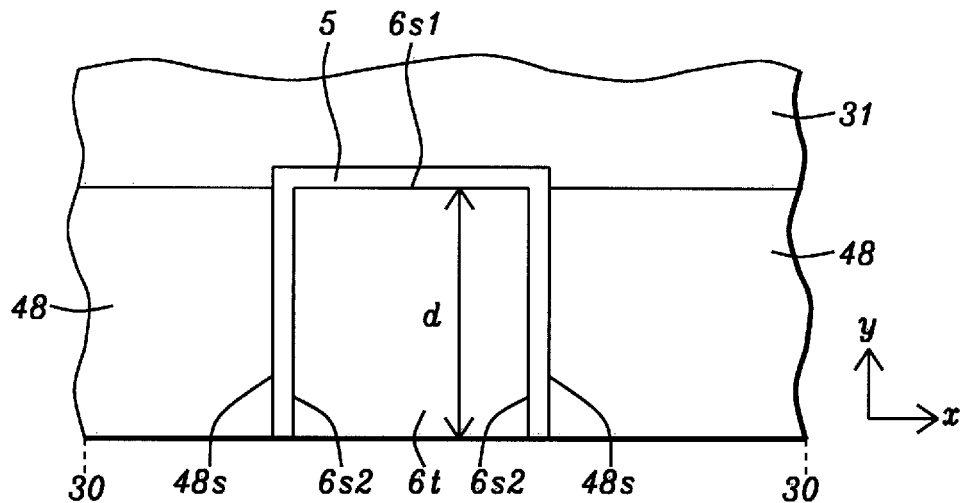
FIG. 7 is a top-down view of the embodiment in FIG. 5 where the top shield is removed to illustrate the side shields and top surface of the sensor.

According to one embodiment illustrated in a top-down view in FIG. 7 where top shield 7 has been removed to show a top surface 46t of the third magnetic layer in the side shields and a top surface 6t of the sensor, side shield sidewalls 48s extend parallel to sides 6s2 towards a back side 6s1 of the sensor wherein the sensor back side is located a distance d of 30 nm to 2 microns in a y-axis direction from the ABS. Alternatively, the present disclosure anticipates an embodiment wherein side shields extend greater than distance d from the ABS. Preferably, the sidewalls 48s extend at least a distance d to provide a maximum biasing effect to the free layer in the sensor.

Figure 8:
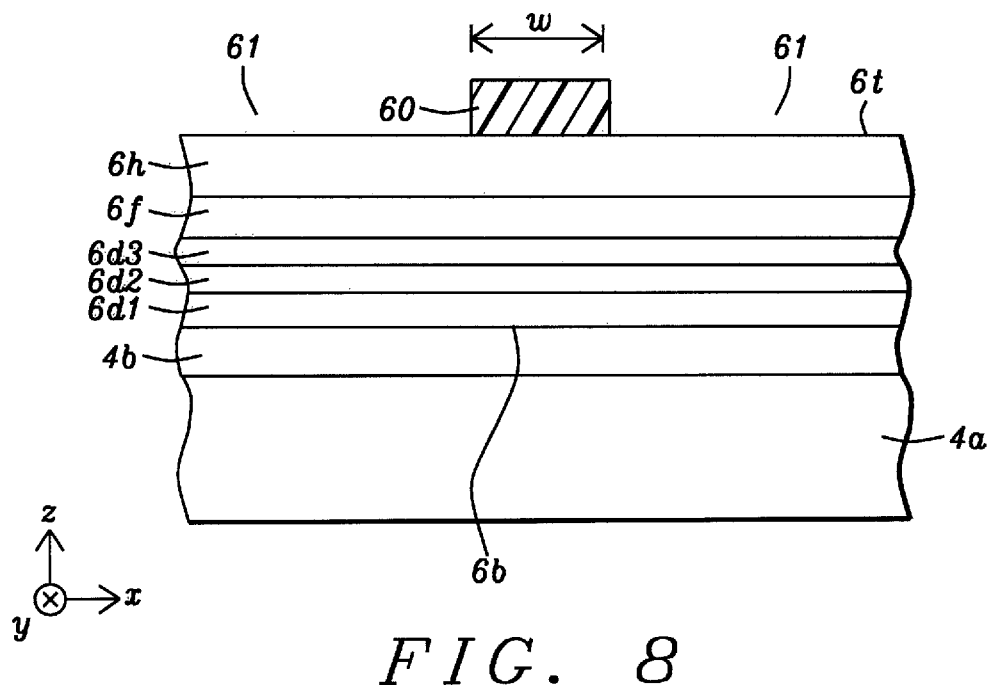
FIGS. 8-10 are cross-sectional views depicting a sequence of steps that are used to fabricate a sensor structure with wrap around shield shields as illustrated in the second embodiment.

The present disclosure also encompasses a method of forming a sensor with a wrap around shield configuration that is stabilized by antiferromagnetic coupling between magnetic layers in the side shields, and is comprised of a high moment layer in each shield to enable a better micro magnetic read width for improved read head performance. In FIG. 8, a first step in a fabrication process is depicted wherein layers 4a, 4b are sequentially formed on a substrate (not shown) by a sputtering method or physical vapor deposition (PVD) process, for example. The bottom shield is annealed by a conventional process to set the magnetizations m1a, m1b in an x-axis direction. Thereafter, layers 6d1, 6d2, 6d3, 6e, 6f, and 6h in the sensor stack are sequentially formed on a top surface of the bottom shield by a sputter deposition process. Layer 6d3 may be a non-magnetic metal such as Cu in a giant magnetoresistive (GMR) sensor or a metal oxide such as MgO in a tunneling magnetoresistive (TMR) sensor. Free layer 6f may be a single layer or a composite with a plurality of magnetic layers. A composite free layer may have a synthetic antiferromagnetic configuration wherein two ferromagnetic layers are separated by a coupling layer such as Ru. The uppermost layer 6h is a capping layer that may be one or more of Ta and Ru, or other materials used in the art.

During the following step in the fabrication sequence, a photoresist layer is spin coated and patterned on the sensor top surface 6t by a conventional photolithography process to generate a pattern including a photoresist island 60 having a width w in the cross-track direction. The photoresist pattern typically includes a plurality of islands arranged in rows and columns from a top-down view that is not shown in order to focus on the key features in the drawing. In one aspect, the island may have a substantially rectangular shape from a top-down view similar to the sensor top surface 6t shown in FIG. 7. There are openings 61 on either side of the photoresist island that expose a substantial portion of top surface 6t. It should be understood that a portion of top surface 6t is also uncovered along a back side (not shown) of photoresist island 60 to completely isolate adjacent islands in the photoresist pattern.

Figure 9:
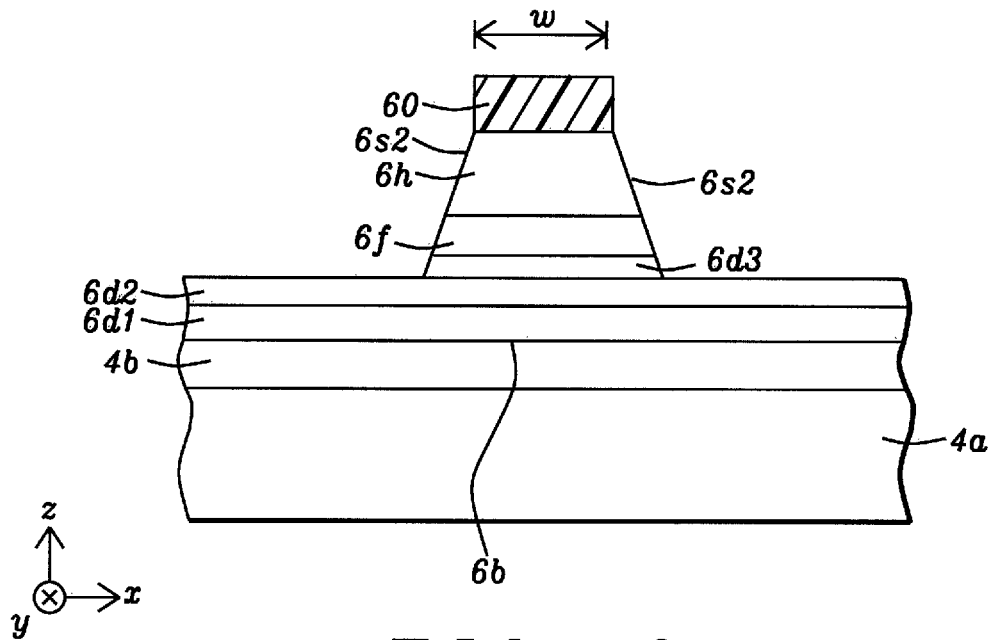

Referring to FIG. 9, an ion milling (ion beam etch or IBE) process as disclosed in related patent application Ser. No. 13/803,362 is performed to transfer the shape of the photoresist island 60 through the sensor stack of layers. In particular, the ion milling process comprises a step wherein ions have an angle of 0 to 10 degrees with respect to a plane (not shown) that is perpendicular to top surface 6t. The etch process stops on a top surface 62 of reference layer 6d2. In an alternative embodiment, the first step is extended to involve an over etch into the SAF reference layer (AP1 layer 53 in FIG. 6) in layer 6d2. The ion milling process may include a second step that features an IBE side trim at an angle of 45 to 75 degrees to reduce the free layer width. When the dimension w is substantially less than 100 nm, then sloped sides 6s2 are usually desirable to prevent collapse of the sensor during a subsequent milling step. An IBE process is generally preferred as the etch method to generate sloped sidewalls since the ions can be angled with respect to the z-axis direction. As a result, the cross-track distance between sides 6s2 in non-magnetic spacer 6d3 is generally greater than the track width w at the top surface of upper layer 6h.

Figure 10:
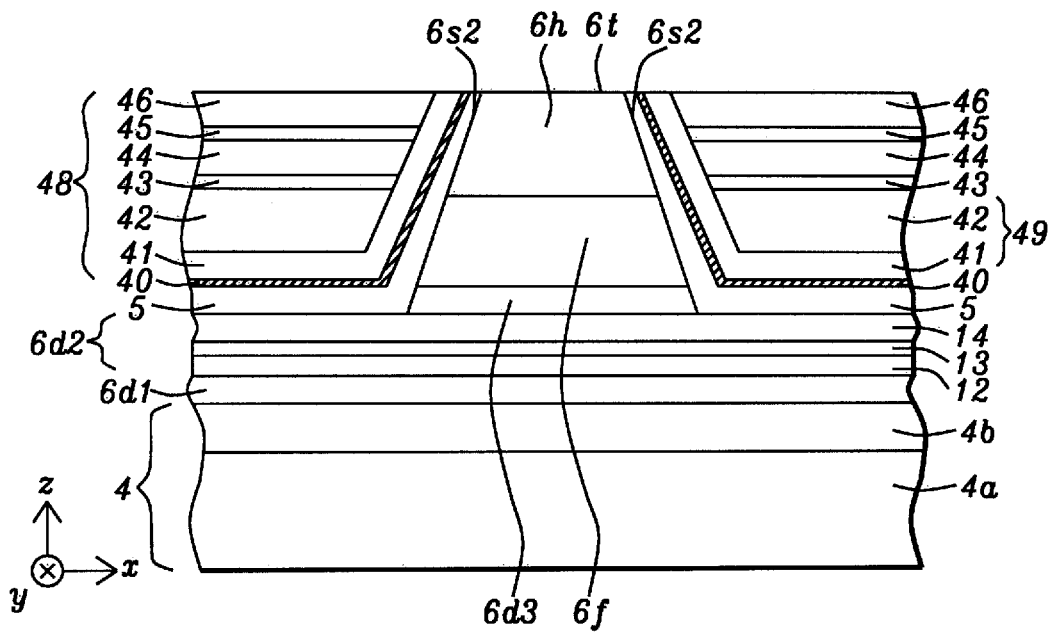

In FIG. 10, insulation layer 5 is deposited along the sides 6s2 and on exposed portions of top surface 62. Next, the side shields 48 are formed adjacent to sides 6s2 by consecutively depositing the seed layer 40, second high moment layer 41, first magnetic layer 42, first AFM layer 43, second magnetic layer 44, second AFM layer 45, and third magnetic layer 46 by an ion beam deposition (IBD) or PVD method. When an IBD method is used for depositing the side shield layers, the deposition angle may be varied. To minimize the overspray, a shaper may be used in IBD deposition steps. The photoresist layer 60 is then removed by a standard liftoff process. A chemical mechanical polish (CMP) process may be employed to form a top surface 46t that is essentially coplanar with a top surface 6t of the sensor.

Thereafter, a top shield is formed by a conventional process to complete the shield structure depicted in FIG. 6. As mentioned previously, a second anneal step may be performed to set the magnetization direction of layers 7a, 7b in top shield 7. However, the anneal conditions should not be too strenuous so as not to affect the magnetization in bottom shield 7 or within the magnetic layers in sensor 6.

In summary, we have disclosed a wrap around shield structure and a method of making the same with improved stabilization that provides biasing to a free layer in an adjacent sensor stack. Furthermore, micro magnetic read width performance is enhanced compared with the prior art. All of the improvements noted herein may be accomplished with materials and processes used in the art. Therefore, enhanced sensor performance in terms of high output sharpness and improved magnetic read width is achieved with no additional cost compared with current fabrication schemes.

While this disclosure has been particularly shown and described with reference to, the preferred embodiment thereof, it will be understood by those skilled in the art that various changes in form and details may be made without departing from the spirit and scope of this disclosure.

We claim:

1. A wrap around shield structure for biasing a free layer in a magnetoresistive (MR) sensor in a read head, the MR sensor has a bottom surface contacting a bottom shield, a top surface contacting a top shield, and sides that connect the top and bottom surfaces, the sides extend from an air bearing surface (ABS) to a back end of the MR sensor, comprising:
   (a) the bottom shield that is a composite including a first high moment layer with a magnetization saturation (Ms) value greater than a Ms value for $Ni_{70}Fe_{30}$ and a bottom layer that is NiFe or an alloy thereof with a Fe content <30 atomic %, the first high moment layer adjoins the bottom layer and has a top surface contacting the MR sensor bottom surface;
   (b) a composite side shield formed along each MR sensor side, comprising:
      (1) a seed layer that is formed along the MR sensor sides and above a portion of the bottom shield which does not contact the MR sensor;
      (2) a second high moment layer that is CoFe, CoFeM where M is a metallic element, Fe, or FeNi with a Ms value greater than that of $Ni_{70}Fe_{30}$ and formed on the seed layer;
      (3) a first magnetic layer contacting a top surface of the second high moment layer, the first magnetic layer and second high moment layer provide a majority of biasing to the free layer;
      (4) a first antiferromagnetic (AFM) coupling layer on the first magnetic layer;
      (5) a second magnetic layer formed on the first AFM coupling layer;
      (6) a second AFM coupling layer on the second magnetic layer; and
      (7) a third magnetic layer formed as the uppermost layer in each composite side shield, the third magnetic layer contacts the top shield and has a magnetization in a same direction as a magnetization in the first magnetic layer, and as a magnetization in the first and second high moment layers, and has a top surface that is coplanar with the MR sensor top surface; and
   (c) the top shield that is a composite including an upper magnetic layer and a third high moment layer with a Ms value greater than that of $Ni_{70}Fe_{30}$, the third high moment layer adjoins the upper magnetic layer, and contacts the MR sensor top surface and the third magnetic layer top surface, and has a magnetization in the same direction as the first high moment layer.

2. The wrap around shield structure of claim 1 wherein the seed layer has a thickness from about 5 to 50 Angstroms and is comprised of one or more of Ru and Ta, NiCr, NiFeCr, NiFe, Cu, or Ni, or is a composite with a Ta/NiCr, Ta/NiFeCr, Ta/NiFe, Ta/Cu, or Ta/Ni configuration, or is a composite wherein Ta in the aforementioned configurations is replaced by Hf, Ti, Zr, Nb, or Mo.

3. The wrap around shield structure of claim 1 wherein the first magnetic layer, second magnetic layer, and third magnetic layer are comprised of one or both of CoFe and NiFe wherein Ni has a content from about 70 to 90 atomic %.

4. The wrap around shield structure of claim 1 wherein the first high moment layer, second high moment layer, and third high moment layer are CoFe or a CoFeM alloy in which M is one or more of Ni, Mo, Hf, Zr, and Nb wherein the M content is less than about 10 atomic % of the CoFeM alloy, or are Fe or a FeNi alloy in which the Fe content is greater than 30 atomic %.

5. The wrap around shield structure of claim 1 wherein the first high moment layer, second high moment layer, and third high moment layer each have a thickness from about 5 to 50 Angstroms.

6. The wrap around shield structure of claim 1 wherein the first AFM coupling layer and second AFM coupling layer are selected from Ru, Rh, RhRu, Re, Ir, and Mo.

7. The wrap around shield structure of claim 1 wherein an insulation layer is formed between the seed layer and bottom shield, and between the MR sensor sides and the seed layer.

8. The wrap around shield structure of claim 1 wherein each side shield extends for a distance of about 30 nm to 2 microns in a direction perpendicular to the ABS and toward a back end of the read head.

9. The wrap around shield structure of claim 1 wherein the upper magnetic layer is ferromagnetically coupled to the third high moment layer, and wherein the bottom magnetic layer is ferromagnetically coupled to the first high moment layer.

10. A wrap around shield structure for biasing a free layer in a magnetoresistive (MR) sensor in a read head, the MR sensor has a bottom layer contacting a bottom shield, a top surface contacting a top shield, and two sides that extend from an air bearing surface (ABS) to a back end of the MR sensor, comprising:
   (a) the bottom shield that is a composite including a first high moment layer with a magnetization saturation (Ms) value greater than a Ms value for $Ni_{70}Fe_{30}$ and a bottom layer that is NiFe or an alloy thereof with a Fe content <30 atomic %, the first high moment layer adjoins the bottom layer and has a top surface contacting the bottom layer in the MR sensor, and the two sides connect the MR sensor top surface with a top surface of a reference layer in the bottom layer;
   (b) a composite side shield formed along each MR sensor sidewall, comprising:
      (1) a seed layer that is formed along the MR sensor sides and on a portion of the top surface of the reference layer that extends beyond the MR sensor sides;
      (2) a second high moment layer that is CoFe, CoFeM where M is a metallic element, Fe, or FeNi with a Ms value greater than that of $Ni_{70}Fe_{30}$ and formed on the seed layer;

(3) a first magnetic layer contacting a top surface of the second high moment layer, the first magnetic layer and second high moment layer provide a majority of biasing to the free layer;
(4) a first antiferromagnetic (AFM) coupling layer on the first magnetic layer;
(5) a second magnetic layer formed on the first AFM coupling layer;
(6) a second AFM coupling layer on the second magnetic layer; and
(7) a third magnetic layer formed as the uppermost layer in each composite side shield, the third magnetic layer contacts the top shield and has a magnetization in a same direction as a magnetization in the first magnetic layer, and as a magnetization in the first and second high moment layers and has a top surface that is coplanar with the MR sensor top surface; and
(c) the top shield that is a composite including an upper magnetic layer and a third high moment layer with a Ms value greater than that of $Ni_{70}Fe_{30}$, the third high moment layer adjoins the upper magnetic layer, and contacts the MR sensor top surface and the third magnetic layer top surface, and has a magnetization in the same direction as the first high moment layer.

11. The wrap around shield structure of claim 10 wherein the MR sensor has a bottom spin valve configuration wherein the bottom layer has a seed layer, antiferromagnetic (AFM) layer, and a synthetic antiferromagnetic (SAF) reference layer sequentially formed on the bottom shield, the SAF reference layer has a lower magnetic layer/coupling layer/upper magnetic layer configuration wherein the upper magnetic layer contacts a bottom surface of a non-magnetic spacer, and a free layer contacts a top surface of the non-magnetic spacer.

12. The wrap around shield structure of claim 10 wherein the first magnetic layer, second magnetic layer, and third magnetic layer are comprised one or both of CoFe and NiFe wherein Ni has a content from about 70 to 90 atomic %.

13. The wrap around shield structure of claim 10 wherein the first high moment layer, second high moment layer, and third high moment layer are CoFe or a CoFeM alloy in which M is one or more of Ni, Mo, Hf, Zr, and Nb wherein the M content is less than about 10 atomic % of the CoFeM alloy, or are Fe or a FeNi alloy in which the Fe content is greater than 30 atomic %.

14. The wrap around shield structure of claim 10 wherein the first high moment layer, second high moment layer, and third high moment layer each have a thickness from about 5 to 50 Angstroms.

15. The wrap around shield structure of claim 10 wherein the first AFM coupling layer and second AFM coupling layer are selected from Ru, Rh, RhRu, Re, Ir, and Mo.

16. The wrap around shield structure of claim 10 wherein an insulation layer is formed between the side shield seed layer and a top surface of the reference layer, and between the MR sensor sides and the side shield seed layer.

17. The wrap around shield structure of claim 10 wherein each side shield extends for a distance of about 30 nm to 2 microns in a direction perpendicular to the ABS and toward a back end of the read head.

18. The wrap around shield structure of claim 10 wherein the upper magnetic layer is ferromagnetically coupled to the third high moment layer, and wherein the bottom magnetic layer is ferromagnetically coupled to the first high moment layer.

* * * * *